United States Patent [19]

Köhler et al.

[11] Patent Number: 5,145,895

[45] Date of Patent: Sep. 8, 1992

[54] BLENDS OF MODIFIED POLYARYLENE SULFIDES AND POLYCARBONATES

[75] Inventors: Burkhard Köhler, Krefeld; Klaus Reinking, Wermelskirchen, both of Fed. Rep. of Germany

[73] Assignee: Bayer Aktiengesellschaft, Leverkusen, Fed. Rep. of Germany

[21] Appl. No.: 737,320

[22] Filed: Jul. 29, 1991

[30] Foreign Application Priority Data

Aug. 11, 1990 [DE] Fed. Rep. of Germany ....... 4025561

[51] Int. Cl.$^5$ ...................... C08L 69/00; C08L 81/00; C08K 5/42
[52] U.S. Cl. .................................. 524/160; 524/158; 524/537; 525/462; 525/537; 525/439; 528/388
[58] Field of Search ..................... 525/462, 537, 439; 528/388; 524/158, 160, 537

[56] References Cited

U.S. PATENT DOCUMENTS

| | | | |
|---|---|---|---|
| 3,839,301 | 10/1974 | Scoggins | 525/537 |
| 4,021,596 | 5/1977 | Bailey | 525/462 |
| 4,046,836 | 9/1977 | Adelmann | 525/462 |
| 4,663,431 | 5/1987 | Fujii | 525/388 |

FOREIGN PATENT DOCUMENTS 3534946 4/1987 Fed. Rep. of Germany .
3900260 9/1989 Fed. Rep. of Germany .

*Primary Examiner*—Ana L. Carrillo
*Assistant Examiner*—David Buttner
*Attorney, Agent, or Firm*—Connolly and Hutz

[57] ABSTRACT

The invention relates to blends of modified polyarylene sulfides (PAS), preferably polyphenylene sulfides (PPS), with polycarbonates.

5 Claims, No Drawings

BLENDS OF MODIFIED POLYARYLENE SULFIDES AND POLYCARBONATES

This invention relates to blends of modified polyarylene sulfides (PAS), preferably polyphyenylene sulfides (PPS), and polycarbonates.

Blends of various thermoplastics are intended synergistically to combine the positive properties of both components. Whereas total miscibility of the components often only leads to arithmetic averaging of the properties, two-phase blends often show unsatisfactory mechanical properties.

Two-phase blends showing a certain transition between both phases (coupling) would be desirable.

blends of PAS with polycarbonates can have the following positive -properties by comparison with unmodified PAS:

1) improved toughness (polycarbonate of 2,2-bis-(4-hydroxyphenyl)-propane (BPA),
2) constant modulus at relatively high temperatures (amorphous poly(ester)carbonates of terephthalic and isophthalic acid ester groups, carbonate ester groups and bisphenols, for example BPA, or 1,1-bis-)4-hydroxyphenyl)-cyclohexane-(BPZ), 1,1-bis-(4-hydroxyphenyl)-3,3,5-trimethyl cyclohexane (HIP-BP)),
3) high rigidity (polyester carbonates which form a liquid crystalline melt).

The coupling of PAS with polymers containing carbonate ester groups is often inadequate so that no synergistic effects are obtained.

It has now been found that blends of modified PAS (preferably modified PPS) with polymers containing carbonate ester groups (preferably aromatic polycabonates) show improved mechanical properties.

Accordingly, the present invention relates to blends of

A) 1 to 99% by weight and preferably 10 to 90% by weight modified polyarylene sulfides prepared by mixing 100 parts PAS and preferably 100 parts PPS in the melt with 0.1 to 10 parts and preferably with 0.5 to 3 parts sulfo-group-containing phenols corresponding to formula (I)

$$(HO)_n-Ar-(SO_3H)_m \quad (I)$$

in which
n and m =1 or 2, preferably 1, and Ar is an (n+m)-functional aromatic radical containing to 6 to 14 carbon atoms, preferably a napthylene radical, B) 1 to 99% by weight and preferably 10 to 90% by weight polymers containing carbonate ester groups and C) 0 to 300% by weight, based on the sum of (A+B), glass fibers and/or mineral fillers.

Examples of component B are polycarbonates of BPA, BPZ and HIP-BP, amorphous polyester carbonates of isophthalic and/or terephthalic acid ester groups, carbonate ester groups and bisphenols, polyester carbonates forming a liquid crystalline melt and containing ester groups of carbonic acid, isophthalic and/or terephthalic acid, 4-hydroxybenzoic acid and hydroquinone and/or 4,'-dihydroxy-bipehnyl as bisphenols.

Polycarbonates are commercially obtainable (for example Makrolon ®, a product of Bayer AG).

The components A are produced, for example, by extrusion of PPS (for example TEDUR ®), with 4-sulfophenol, 1-hydroxynapthalene-2-sulfonic acid, 1-hydroxynaphthalene-4sulfonic acid, 2-hydroxynaphthalene-1-sulfonic acid, 2-hydroxynaphthalene-3-sulfonic acid, preferably the naphthalene compounds, at 320° C. in a Werner & Pfleiderer ZSK 32 twin-screw extruder.

The sulfophenols and naphthols are commercially available.

Suitable mineral filers and reinforcing materials are, for example, glass fibers, glass beads, mica, talcum, silica flour, metal oxides and sulfides, for example $TiO_2$, ZnS, graphite, carbon black, quartz or carbon fibers, carbonates, for example $MgCO_3$, $CaCo_3$, or sulfates, such as for exmaple $CaSO_4$, $BaSO_4$.

The blends according to the invention may be produced in the usual way the extrusion.

Pigments, mold release agents, E waxes, flow aids, nucleating agents or stabilizers may be used as further typical additives.

The blends according to the invention may be processed by standard methods to molding, semi-finished products, circuit boards, fibers, films, profiles, etc.

EXAMPLES

Mixing in the melt was carried out at 320° C. in a ZSK 32 twin-screw extruder. The PPS used was produced in accordance with EP 171 021.

COMPARISON EXAMPLE 1

60% by weight PPS having a melt viscosity of 40 Pas (310° C. 1000 $s^{-1}$) and 40% by weight Makrolon ®2808 (BPA polycarbonate, a product of Bayer AG) were blended.

COMPARISON EXAMPLE 2

40% by weight PPS, 40% by weight CS 7916 ® (glass fibers containing an aminosililane coupling agent, a product of Bayer AG) and 20% by weight Makrolon ® 2808 were blended.

SYNTHESIS EXAMPLE (MODIFIED PPS)

98% by weight PPS were mixed with 2% by weight 1-hydroxy-2-naphthalene sulfonic acid.

EXAMPLE 1

60% by weight modified PPS and 40% by weight Makrolon ® 2808 were blended.

EXAMPLE 2

40% by weight modified PPS, 40% by weight CS 7916 ® and 20% by weight Makrolon ® 2808 were blended.

The results obtained are shown in The following Table:

|  | Flexural strength (MPa) | Outer fiber strain (%) | Modulus in bending (MPa)- | Izod notched impact strength $a_n$ (kJ/m²) |
|---|---|---|---|---|
| Comp. 1 | 102 | 3.7 | 3075 | 13.6 |
| 1 | 116 | 5.4 | 3026 | 15.4 |
| Comp. 2 | 206 | 1.9 | 11024 | 21.3 |
| 2 | 239 | 2.1 | 11795 | 26.2 |

The blends of PPS modified in accordance with the invention and polycarbonate show better toughness values and flexural strengths than the blends with unmodified PPS.

Claims

1. Blends of

A) 1 to 99% by weight modified polyarylene sulfides prepared by mixing 100 parts PAS in the melt with 0.1 to 10 parts sulfo-group-containing phenols corresponding to formula (I)

$$(HO)_n-Ar-(SO_3H)_m \qquad (I),$$

in which n and m=1 or 2 and Ar is an (n+m)-functional aromatic radical containing to 6 to 14 carbon atoms, B) 1 to 99% by weight polymers containing carbonate ester groups and C) 0 to 300% by weight, based on the sum of (A+B), mineral fillers.

2. The blends as claimed in claim 1, wherein there is 10-90% by weight of component A.

3. The blends as claimed in claim 1, wherein in component A there is 0.5 to 3 parts sulfo-group-containing phenols.

4. The blends as claimed in claim 1, wherein n and m are equal to 1.

5. The blends as claimed in claim 1, wherein in component B is 10-90% by weight.